United States Patent
Yamaguchi et al.

(10) Patent No.: US 7,533,570 B2
(45) Date of Patent: May 19, 2009

(54) ELECTROSTATIC-CAPACITANCE-TYPE ACCELERATION SENSOR

(75) Inventors: Yasuo Yamaguchi, Chiyoda-ku (JP); Makio Horikawa, Chiyoda-ku (JP); Mika Okumura, Chiyoda-ku (JP); Kimitoshi Satou, Chiyoda-ku (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 11/278,904

(22) Filed: Apr. 6, 2006

(65) Prior Publication Data
US 2007/0062285 A1    Mar. 22, 2007

(30) Foreign Application Priority Data
Sep. 20, 2005    (JP)    ............................. 2005-271519

(51) Int. Cl.
*G01P 15/125*    (2006.01)
*G01P 21/00*    (2006.01)

(52) U.S. Cl. .................. 73/514.32; 73/514.01; 73/1.38

(58) Field of Classification Search ............. 73/514.01, 73/493, 431, 514.32, 514.16, 514.17, 514.18, 73/514.35, 514.36, 1.38, 1.39
See application file for complete search history.

(56) References Cited

U.S. PATENT DOCUMENTS

| | | | |
|---|---|---|---|
| 5,545,912 A | | 8/1996 | Ristic et al. |
| 5,668,033 A | * | 9/1997 | Ohara et al. ............... 438/113 |
| 5,760,290 A | * | 6/1998 | Ueyanagi ..................... 73/1.39 |
| 6,528,724 B1 | * | 3/2003 | Yoshida et al. .............. 174/541 |
| 6,759,591 B2 | * | 7/2004 | Yoshida et al. .............. 174/520 |
| 6,763,716 B2 | * | 7/2004 | Nagahara et al. ............. 73/493 |
| 6,953,993 B2 | | 10/2005 | Yamaguchi |
| 6,988,407 B2 | * | 1/2006 | Yamaguchi et al. .......... 73/493 |
| 7,150,195 B2 | * | 12/2006 | Jacobsen et al. ............. 73/715 |
| 7,216,541 B2 | * | 5/2007 | Kato et al. ............... 73/514.32 |
| 2005/0101161 A1 | | 5/2005 | Weiblen et al. |

FOREIGN PATENT DOCUMENTS

| | | |
|---|---|---|
| DE | 695 24 539 T2 | 7/2002 |
| DE | 103 40 938 A1 | 3/2005 |
| DE | 103 52 002 A1 | 6/2005 |
| JP | 9-61456 * | 3/1997 |
| JP | 2000-150916 | 5/2000 |

* cited by examiner

*Primary Examiner*—Helen C. Kwok
(74) *Attorney, Agent, or Firm*—Oblon, Spivak, McClelland, Maier & Neustadt, P.C.

(57) ABSTRACT

In an electrostatic-capacitance-type acceleration sensor, water, etc. penetrating into a sealed space incorporating an acceleration detector having a movable electrode 6, and sticking of the movable electrode 6 to a cap 8 due to static charge accumulated on the cap 8 during the anodic bonding being performed are prevented. A conductive shielding film 9 that can be extendedly transformed on the entire inner face of the cap 8 constituting the sealed space is provided, which is not only extendedly arranged so as to be sandwiched between a bonding frame 7 and the cap 8, but also electrically connected to the movable electrode 6; thereby, even if unevenness exists on the surface of the bonding frame 7, not only sufficient anodic bonding between the bonding frame 7 and the cap 8 becomes possible, but also the electric field due to the static charge accumulated in the cap 8 can be shielded.

8 Claims, 6 Drawing Sheets

ELECTROSTATIC-CAPACITANCE-TYPE ACCELERATION SENSOR

BACKGROUND OF THE INVENTION

1. Field of the Invention

The present invention relates to electrostatic-capacitance-type acceleration sensors formed using semiconductor micromachining technology.

2. Description of the Related Art

In such acceleration sensors, in order to suitably vibrate their movable electrodes, which are mass bodies constituting acceleration detectors, in a vacuum or inert gas, the acceleration detectors need to be sealed with a separator such as a glass cap; meanwhile, in order to output a signal, from the acceleration detectors installed inside the glass cap, to the exterior, wires also need to be provided passing through the separator.

Accordingly, an acceleration sensor is disclosed in Patent Document 1, in which a glass cap (cap) is anodically bonded to a bonding frame (frame) made of single-crystalline silicon in which impurities such as phosphorus are doped at a relatively low level, so as to form a tight-sealed space. That is, a bonding frame is formed of a high-resistant single-crystalline silicon layer provided on an insulating layer using a silicon oxide film, and also single-crystalline silicon layer of the same high-resistance is used as wirings, with impurities such as phosphorus being diffused.

[Patent Document 1]

Japanese Laid-Open Patent Publication 150,916/2000 (FIG. 2)

SUMMARY OF THE INVENTION

In such acceleration sensors, because a single-crystalline silicon layer provided as the bonding frame is used in order to output a signal, from the acceleration detector installed inside the glass cap, to the exterior, a bonding zone also needs to be formed using a high-resistant single-crystalline silicon layer. Moreover, because a single-crystalline silicon layer provided as the bonding frame is also used, flexibility in wiring design is limited, for example, the wiring cannot be multi-layered.

Due to the above reason, recently, the bonding frame and the wiring have been configured with polycrystalline silicon and an insulating film being stacked. However, in a case of the polycrystalline silicon, surface irregularities generally become larger than that of single-crystalline silicon, and in addition, in a case of the stacked structure, the irregularities of the under layer of the bonding frame affect the polycrystalline-silicon surface in the upper layer; consequently, the irregularities have tended to become further larger. When irregularities such as above become larger exceeding a certain level, sealing between the glass cap and the bonding frame by the anodic bonding becomes insufficient, causing water, etc. to penetrate into the sealed space; consequently, a problem has occurred in that its electrical characteristics, as the acceleration sensor, vary over time.

Moreover, in manufacturing of such an acceleration sensor, the glass cap and the bonding frame are bonded by the anodic bonding as described above; accordingly, because static charge generates in the glass cap due to voltage applied when the anodic bonding is performed, a problem has also occurred in that the movable electrode constituting the acceleration detector moves towards the glass cap side and is stick-bonded.

An objective of the present invention, which is made to solve the above described problems, is to provide an acceleration sensor in which not only flexibility in wiring design is ensured, but sealing of the acceleration detector can be ensured, and the movable electrode can also be prevented from moving towards the glass cap side and being stick-bonded.

In order to achieve the objective, an electrostatic-capacitance-type acceleration sensor according to the present invention comprises: a substrate including an acceleration detector having a movable part for detecting acceleration; a bonding frame fixed on the substrate so as to surround the acceleration detector; a cap provided on the substrate, the face of the cap opposed to the substrate being constituted by a peripheral region affixed to the bonding frame, and in addition to the peripheral region, a central region; and a conductive shielding film formed at least on the entire surface of the central region of the cap, wherein the shielding film is electrically connected to the movable part. Moreover, in an electrostatic-capacitance-type acceleration sensor according to the present invention, the shielding film is formed extending onto the surface of the peripheral region.

As configured above, in the electrostatic-capacitance-type acceleration sensor according to the present invention, the movable electrode of the acceleration detector can be prevented from moving towards the cap side and being stick-bonded, and the electrical characteristics can also be prevented from varying over time, with the sealing inside the cap being maintained.

DETAILED DESCRIPTION OF THE PREFFERRED EMBODIMENTS

Embodiment 1.

Figure 1:
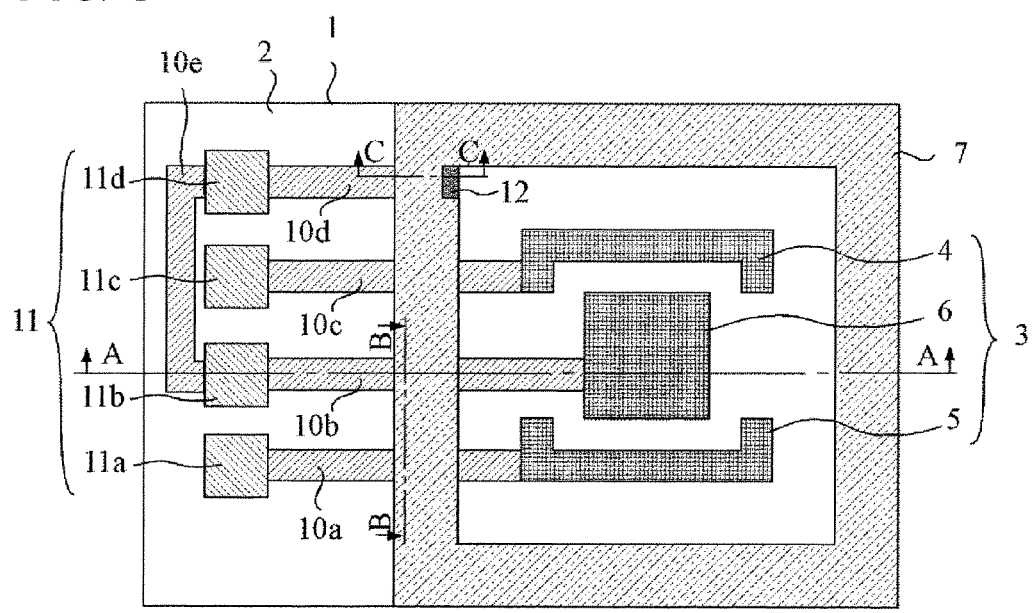
FIG. 1 is a plane view illustrating an acceleration sensor in Embodiment 1 according to the present invention, and a cross-sectional view along the A-A line of the plane view.
Figure 1:
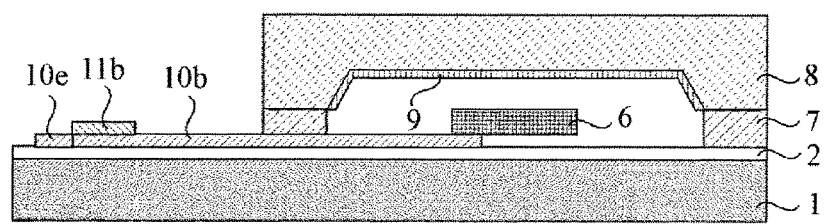

Hereinafter, Embodiment 1 according to the present invention is explained based on figures. FIG. 1 is a plane view illustrating an acceleration sensor in Embodiment 1 according to the present invention, and a cross-sectional view along A-A of the plane view. A cap is conveniently omitted in the plane view.

In FIG. 1, a semiconductor substrate 1 made of silicon has two main opposing faces parallel to each other, in which the thickness of the substrate is 400 µm and the size thereof 2.25 mm×2.5 mm in rectangular shape. A heat oxide film 2 whose thickness is 1.6 µm is provided, for insulation, on the upper face of the semiconductor substrate 1. An acceleration detector 3 whose thickness is 8 µm is provided over the semiconductor substrate 1 sandwiching the heat oxide film 2. The acceleration detector 3 is composed of a first fixed electrode 4, a second fixed electrode 5, and a movable electrode 6; thereby, acceleration is detected from variation of the capacitance between the first and second fixed electrodes 4 and 5 and the movable electrode 6. Thus, because the first fixed electrode 4, the second fixed electrodes 5, and the movable electrode 6 operate as capacitors, the electrodes are made of low-resistant polycrystalline silicon in which, in order to give them conductivity, impurities such as phosphorus are doped, that is, the electrodes are made of doped poly-silicon. Here, the movable electrode 6, in order to give mobility thereto, is movably supported in a floating state over the semiconductor substrate 1.

Moreover, a bonding frame 7 composed of a lamination including polycrystaline silicon and an insulating film is provided on the semiconductor substrate so as to surround the periphery of the acceleration detector 3, and a cap 8 made of glass, etc. airtightly bonded by the anodic bonding is provided on the bonding frame; thereby, the detector is isolated from the surroundings. The periphery of the face, facing the semiconductor substrate 1, of the cap 8 is a bonding face with the bonding frame 7; a recess is formed on the portion except for the periphery so that the portion does not contact the acceleration detector 3, by sandblast processing or etching processing. In order to prevent the movable electrode 6 from breaking or running upon the fixed electrode when the movable electrode 6 moves towards the cap, in this embodiment, the depth of the recess is set at 9 μm, which is equivalent to the thickness of the movable electrode 6. On the surface on which the recess of the cap 8 is formed, a shielding film 9 whose thickness is 0.1 μm is formed. The shielding film 9 is made of conductive material that can be extendedly transformed; here, aluminum is used in this embodiment. The shielding film 9 is not only formed on the surface in which the recess of the cap 8 is formed, but also, although not illustrated in FIG. 1, extendedly formed on the face, facing the bonding frame 7, of the periphery of the cap 8. A plurality of wirings 10a, 10b, 10c, and 10d, whose thickness is 0.4 μm, made of doped poly-silicon are arranged extending from the first fixed electrode 4, the second fixed electrode 5, the movable electrode 6, and the bonding frame 7, respectively, on the semiconductor substrate 1, so that each wiring is connected to respective external output electrodes 11a, 11b, 11c, and 11d, provided, passing through the bonding frame 7, on the semiconductor substrate 1 outside the bonding frame 7. Further more, the electrode 11b and the electrode 11d are electrically connected together with a wiring 10e.

Figure 2:
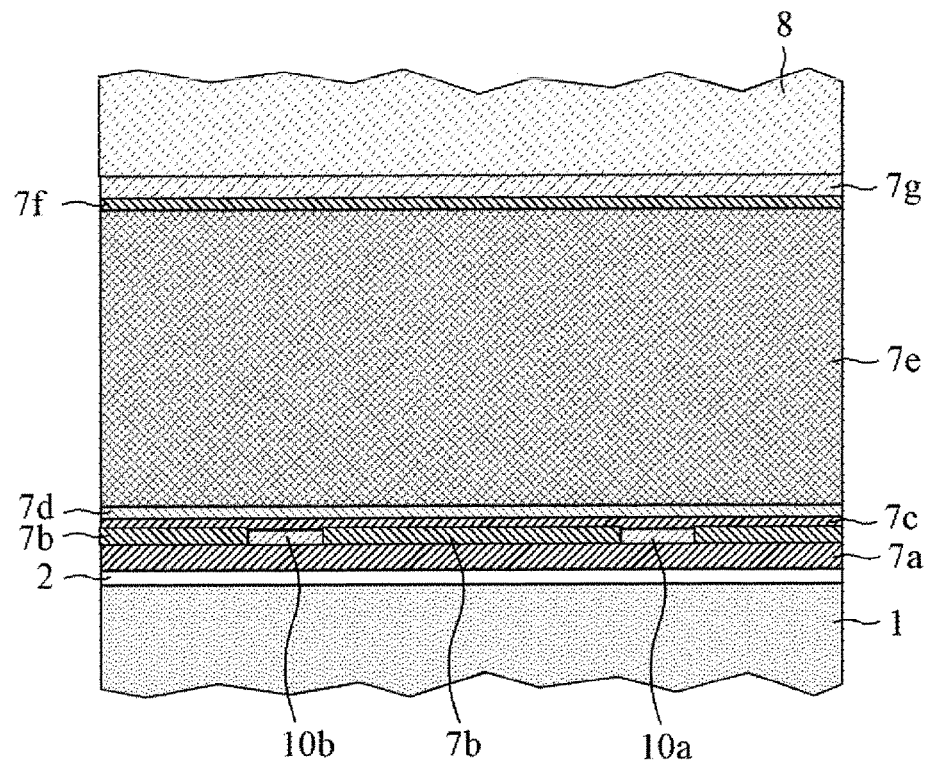
FIG. 2 is a cross-sectional view along B-B of FIG. 1.

FIG. 2 is a cross-sectional view, along the B-B line of FIG. 1, explaining in detail the structure of the bonding frame 7. As represented in FIG. 2, the bonding frame 7 is configured as a lamination including a high-temperature oxide film 7a whose thickness is 0.7 μm, a TEOS oxide film 7b whose thickness is 0.45 μm, a high-temperature oxide film 7c whose thickness is 0.1 μm, a nitride film 7d whose thickness is 0.1 μm, a doped poly-silicon film 7e whose thickness is 8 μm, a TEOS oxide film 7f whose thickness is 0.1 μm, and a non-doped poly-silicon film 7g, as a polycrystalline silicon film in which impurities are not doped, whose thickness is 0.6 μm, which are sequentially formed on the heat oxide film 2 on the semiconductor substrate 1. Here, the TEOS oxide film is a silicon dioxide film formed by a CVD method in which TEOS (tetra ethyl ortho silicate) is used as a silicon source. Part of the TEOS oxide film 7b is replaced with the wiring 10 (10a, 10b, 10c, and 10d) that pass through the bonding frame 7. Although not illustrated in the figure, the wiring 10d is processed so as to be electrically connected to the doped poly-silicon film 7e.

In this embodiment, although the non-doped poly-silicon film 7g in the uppermost layer and the cap 8 are anodically bonded together, by omitting the TEOS oxide film 7f and the non-doped poly-silicon film 7g, the doped poly-silicon film 7e and the cap 8 can also be directly anodically bonded. However, when the impurities included in the doped poly-silicon film 7e is phosphorus, because a film including phosphorus is formed on the surface of the doped poly-silicon film 7e when the anodic bonding is performed, sufficient bonding strength may not be ensured. When using the non-doped poly-silicon film 7g, because phosphorus is not included as the impurities, and the TEOS oxide film 7f also prevents diffusion of phosphorus from the doped poly-silicon film 7e that lies thereunder, the structure in this embodiment would be more preferable.

Figure 3:
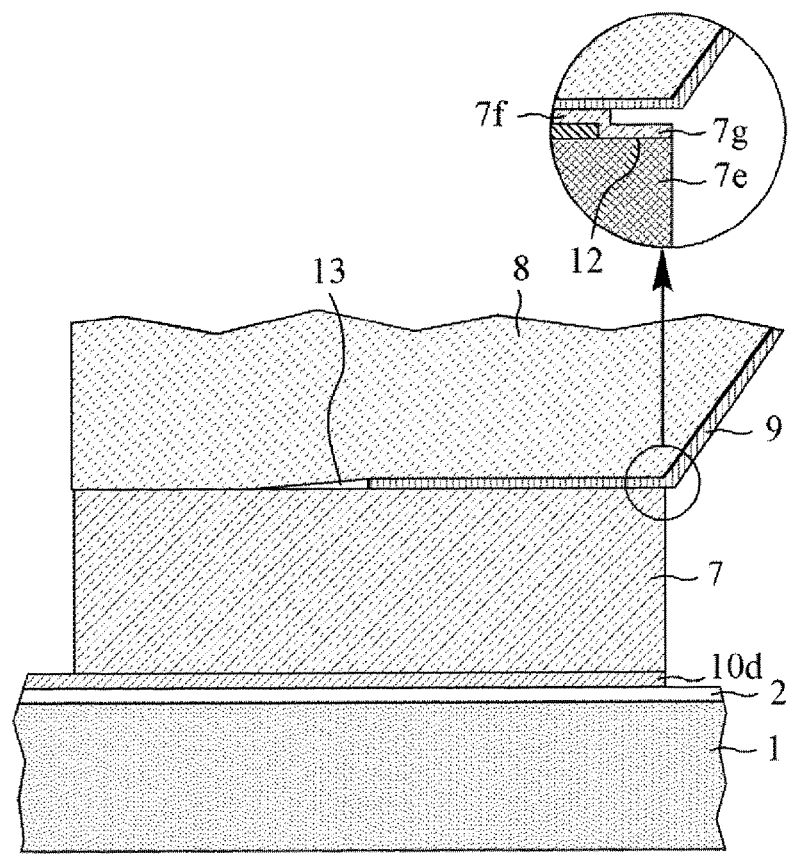
FIG. 3 is a cross-sectional view along C-C of FIG. 1.

FIG. 3 is a detailed cross-sectional view along the C-C line of FIG. 1, and illustrates a bonding structure of the bonding frame 7 and the cap 8, in which part of the shielding film 9 is laid between the bonding frame 7 and the cap 8, along entire perimeter of the bonding portion of the bonding frame 7 and the cap 8. Moreover, the shielding film 9 is not formed on the entire bonding surface of the bonding frame 7, but, as in this embodiment, covers a portion of approximately 100 μm from the inner edge of the bonding surface of the bonding frame 7. When the bonding frame 7 is structured such that the doped poly-silicon film 7e is exposed to the surface, the shielding film 9 and the doped poly-silicon film 7e can be electrically connected with each other in this state; however, when the uppermost layer is structured by the non-doped poly-silicon film 7g as in this embodiment, by providing a potential output region 12 in part of the bonding frame 7, removing the TEOS oxide film 7f in this region, and implanting impurities into the non-doped poly-silicon film 7g of this region so that the resistance becomes lower, the shielding film 9 and the doped poly-silicon film 7e can be electrically connected to each other at this potential output region 12.

The anodic bonding is a technology of bonding an insulator such as glass with a semiconductor such as silicon or a conductor such as metal, which serves to bond, in this embodiment, the bonding frame 7 as the semiconductor with the cap 8 as the insulator are bonded; that is, the bonding is performed by positioning their corresponding portion so that they overlap each other, heating them at a temperature of approximately 400 degrees in vacuum or in an inert gas atmosphere, and applying voltage of several hundred volts across the silicon substrate side as the anode and the cap side as the cathode. The processing time is from several dozen minutes to several hours.

The movable electrode 6 of the acceleration detector 3 is, for detecting acceleration, in a state of being movable freely when force is applied. It has been described, as an objective to aim at, that, because the movable electrode is, during anodic bonding, in a state in which voltage can be applied to the electrode as described above, static charge accumulates on the cap 8, inducing electrostatic force, thereby the movable electrode is likely to move towards the cap side and be stick-bonded; accordingly, in order to solve such a problem, the shielding film 9 represented in this embodiment is provided. That is, if, when the anodic bonding is performed, the shielding film 9 and the movable electrode 6 are made to be electrically connected so that both the film and the electrode become the same potential, because the electric field due to the static charge accumulated on the cap 8 is shielded, troubles such as sticking of the movable electrode 6 to the cap 8 do not occur. Because, as described above, the shielding film 9 and the doped poly-silicon film 7e are electrically connected to each other, and the doped poly-silicon film 7e and the external output electrode 11d are connected to each other through the wiring 10d, when the anodic bonding is performed, using the wiring 10e, both external output electrodes 11b and 11d have only to be short-circuited. Without regard to whether or not the wiring 10e is removed after the anodic bonding, the original acceleration detecting function cannot be diminished; however, because a shielding function against external electromagnetic noise is maintained when an actual operation is performed, it is preferable to keep the state in which the wiring 10e remains intact so as to short-circuit the external output electrodes 11b and 11d each other.

Moreover, the following can be listed as the effects of the shielding film 9 in this embodiment. Due to not only the lamination being structured by the polycrystalline silicon and the insulating film such as the high-temperature oxide film or the TEOS oxide film, but also the particle size of the polycrystalline silicon also differing from each other, minute irregularities exist on the surface of the bonding frame 7. Generally, in the anodic bonding, although it is considered that sufficient sealed bonding can be performed if such irregularities are not larger than 300 nm, when exceeding this range it becomes difficult to form a sufficiently sealed bonding. However, when the shielding film 9 is also extendedly provided on the face of the cap 8 facing the bonding frame 7, because the shielding film 9 is made of conductive material that can be extendedly transformed, to the film undergoes a compressive force, by the electrostatic force, to plasticizedly transform so as to smooth out the irregularities, resulting in contribution to forming a sufficient sealed bonding. In such acceleration sensors, sealed bonding becomes possible by the anodic bonding even if irregularities exist on the surface of the bonding frame 7, and trouble with sealing failures such as deterioration due to water penetrating into the sensor after long-term usage, and variation in the characteristics when using it under a bad environment, do not occur; consequently, an effect can be brought about in which a precise and reliable acceleration sensor is obtained. In this case, if the shielding film 9 is provided on the entire face of the cap 8 facing the bonding frame 7, because the shielding film 9 is directly exposed to external air, a fear may arise in which corrosion of the conductive material constituting the shielding film 9 gradually progresses from a portion exposed to external air. As described in this embodiment, the provision of the shielding film 9 extending in a limited portion of the bonding face, so that the film is not exposed to the exterior, forms, if not sufficient enough, bonding between the bonding frame 7 and the cap 8, when the thickness of the shielding film 9 is sufficiently thin, even in a region in which the shielding film 9 does not exist, thereby contact of the shielding film 9 with the external gas is prevented; therefore, the progress of the corrosion is remarkably controlled.

Embodiment 2.

In above Embodiment 1, because the shielding film 9 is sandwiched by the bonding frame 7 and the cap 8, due to the thickness of the shielding film 9 itself, as represented in FIG. 3, a region 13 exists in which the bonding frame 7 and the cap 8 are not bonded together. According to the experimental result by the inventors, the region 13 that is not bonded has been found to horizontally extend in a distance of 100-500 times as long as the thickness of the shielding film 9. For example, in above Embodiment 1, the distance reaches 10-50 μm. The thicker the shielding film 9 becomes, the wider becomes the region in which the bonding cannot be performed, which causes the width of the bonded region to correspondingly decrease; however, because the width that must be bonded is predetermined by the product strength, it is more preferable that the thickness of the shielding film 9 is thinner. On the other hand, in a case in which the shielding film 9 is made of metal such as aluminum or gold, if the thickness of the shielding film 9 is too thin, the metal may diffuse or migrate into the silicon or the glass; consequently, the shielding film 9 may partially be lost or cracked. In such cases, the shielding of the electrostatic force, which is the original objective, cannot be performed by keeping the potentials of the shielding film 9 and the acceleration detector 3 equal.

Figure 4:
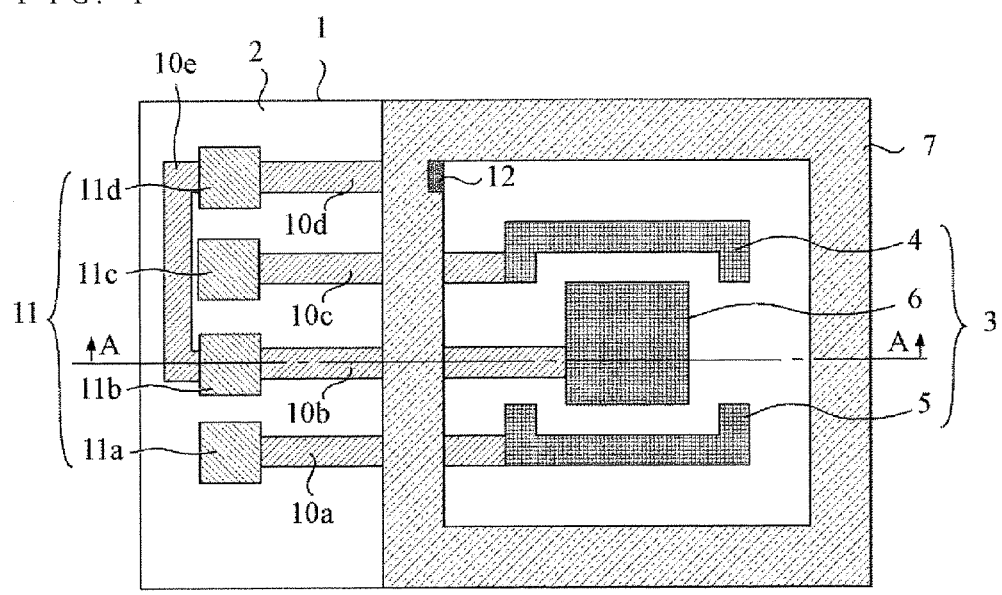
FIG. 4 is a plane view illustrating an acceleration sensor in Embodiment 2 according to the present invention, and a cross-sectional view along A-A of the plane view.
Figure 4:
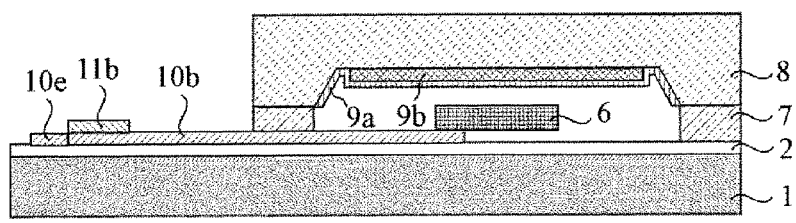

Embodiment 2 is an embodiment coping with the above conflicting matters, and a cross-sectional view of the structure is illustrated in FIG. 4. In this figure, the shielding film 9 is configured using two layers that are a relatively thin first layer 9a and a relatively thick second layer 9b, while the other elements are the same as those in FIG. 1 illustrating the structure in Embodiment 1. The first layer, which is the same as the shielding film in Embodiment 1, is not only formed on the surface on which a recess for the cap 8 is formed, but also extendedly formed on the face facing the bonding frame 7, and the thickness of the layer is 0.1 μm. The second layer is formed only on the surface on which the recess for the cap 8 is formed, and the thickness is preferably not thinner than 0.4 μm; thus, in this embodiment, the thickness is 0.7 μm. Therefore, on the surface on which the recess for the cap 8 is formed, the thickness of the shielding film 9 including the first layer and the second layer reaches 0.8 μm. By structuring such as this, on the surface on which the recess for the cap 8 is formed, the shielding film 9 is ensured to have a sufficient thickness, so that film loss or crack can be prevented; moreover, on the face, facing the bonding frame 7, of the cap 8, because the thickness of the shielding film 9 remains thin, the region 13 that is not bonded does not increase, and a sufficient bonding width can be secured; consequently, the objective described above can be achieved.

Embodiment 3.

Figure 5:
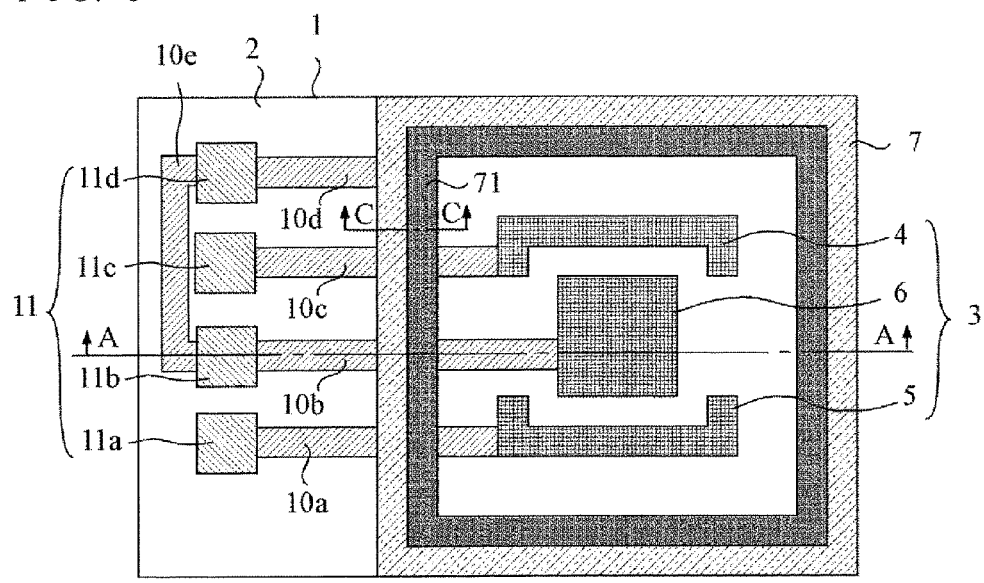
FIG. 5 is a plane view illustrating an acceleration sensor in Embodiment 3 according to the present invention, and a cross-sectional view along A-A of the plane view.
Figure 5:
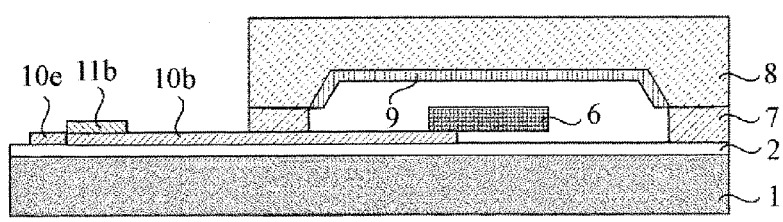
Figure 6:
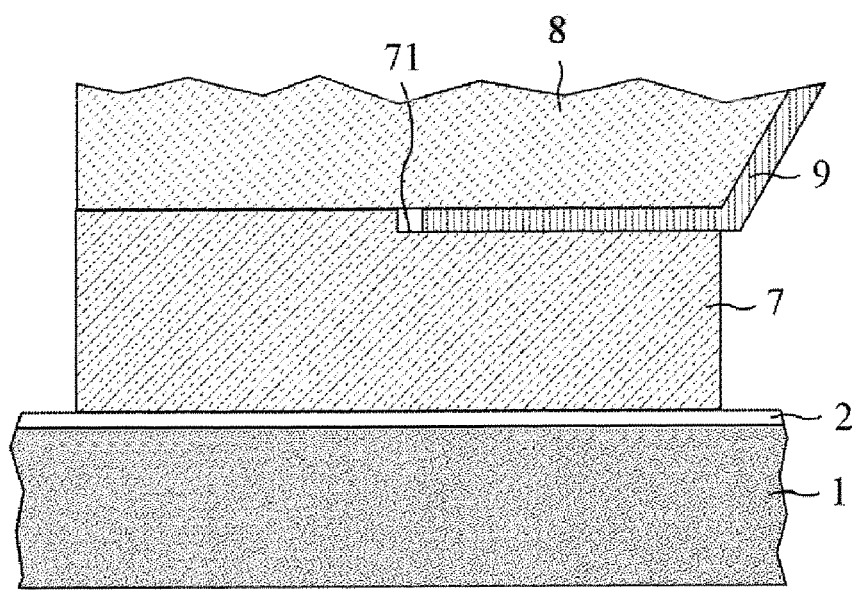
FIG. 6 is a cross-sectional view along C-C of FIG. 5.

Embodiment 3 is another embodiment also coping with the above conflicting matters, in which a detailed structure is illustrated in FIG. 5, and a cross-sectional view along C-C of FIG. 5 is illustrated in FIG. 6. In FIG. 5, the thickness of the shielding film 9 is 0.8 μm, and the other elements are the same as those in FIG. 1 illustrating the structure in Embodiment 1. FIG. 6 represents a bonding structure of the bonding frame 7 with the cap 8, in which part of the shielding film 9 is sandwiched between the bonding frame 7 and the cap 8. On the portion, in which the shielding film 9 is sandwiched, of the bonding frame 7, a nick 71 having a depth that is equivalent to or a little smaller than the thickness of the shielding film 9 is formed entirely along the edge the bonding frame 7. By structuring the bonding frame 7 as described above, it becomes possible to provide the shielding film 9 without restriction from the film thickness; therefore, not only sufficient bonding strength can be ensured, but also the shielding film 9 will never be partially lost or cracked. Moreover, because forming a thicker shielding film 9 enables the structure to cope with larger irregularities of the bonding frame 7, not only the reliability is improved, but also the designing and manufacturing can be carried out without paying attention to the irregularities of the bonding frame 7; consequently, an effect can be obtained in that, for example, processing of smoothing the irregularities can be eliminated. When the bonding frame 7 is structured such that the doped poly-silicon film 7e is exposed to the surface, this nick 71 can be obtained by removing, using etching process, the doped poly-silicon film 7e in the portion corresponding to the bonding frame 7; meanwhile, if the bonding frame 7 is structured such that the uppermost layer thereof is the non-doped poly-silicon film 7g, this nick 71 can be obtained by removing, using etching process, the doped poly-silicon film 7e and the TEOS oxide film 7f in the portions corresponding to the bonding frame 7 in such a way that the removing depth including the thickness of the TEOS oxide film 7f becomes equal to or slightly less than the thickness of the shielding film 9. Here, the non-doped poly-silicon film 7g of this portion needs to have a low resistance by implanting of impurities.

Figure 7:
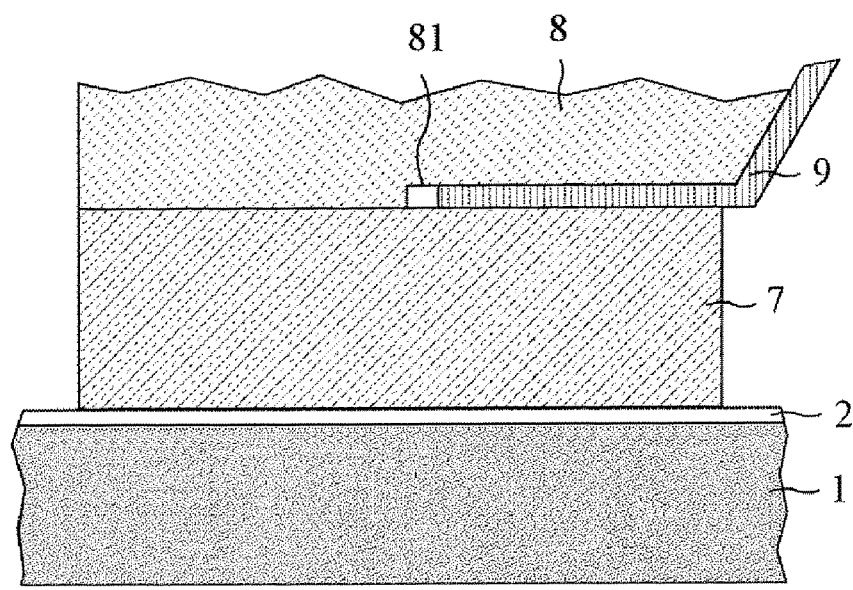
FIG. 7 is a cross-sectional view along C-C of FIG. 5 (modified example)

A nick similar to the above can also be provided on the edge of the cap 8 as illustrated in FIG. 7. FIG. 7 is also a cross-sectional view along C-C of FIG. 5, which represents, in a modified example according to Embodiment 3, a bonding structure of the bonding frame 7 with the cap 8. In FIG. 7, a nick 81 having a depth that is equal to or slightly smaller than the thickness of the shielding film 9 is formed on the side of the cap 8, along the entire edge of the cap 8. Because the operation and effects thereof are similar to those in FIG. 6, the explanation is omitted.

Embodiment 4.

Figure 8:
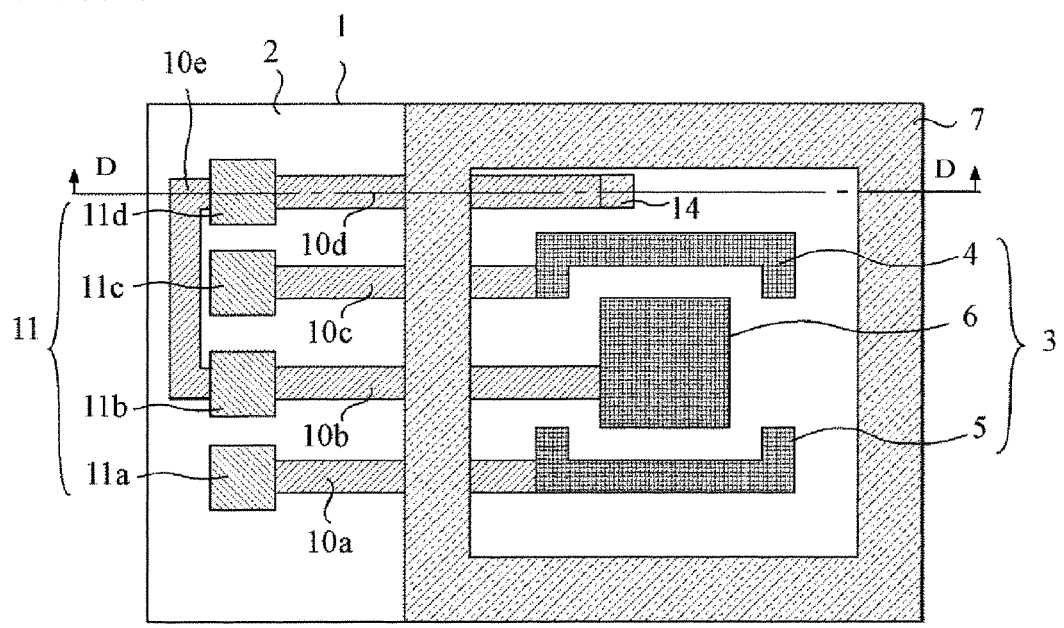
FIG. 8 is a plane view illustrating an acceleration sensor in Embodiment 4 according to the present invention, and a cross-sectional view along D-D of the plane view.
Figure 8:
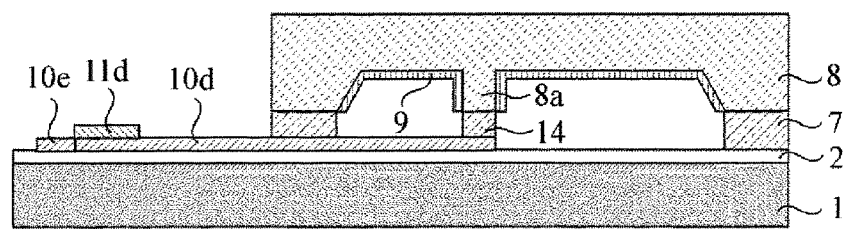

Next, Embodiment 4 according to the present invention is explained based on a figure. FIG. 8 is a plane view illustrating Embodiment 4 of an acceleration sensor according to the present invention, and a cross-sectional view along D-D of the plane view. In the plane view, the cap is also omitted for convenience. In FIG. 8, the potential output region 12 is not provided on the bonding frame 7, but a support 8a is provided on the cap 8, a base 14, electrically connected to the wiring 10d, is provided on the semiconductor substrate 1, and the support 8a and the base 14 are connected to each other through the shielding film 9; while, except for these, the other elements are similar to those in FIG. 1 representing the structure according to Embodiment 1. That is, the role of the potential output region 12 in Embodiment 1 is given to the base 14 provided independently of the bonding frame 7. By configuring as above, the contact area between the support 8a and the base 14 can be constant without being influenced by fluctuations in the manufacturing of the bonding frame 7, the cap 8, and the shielding film 9, as well as fluctuations in the positioning of the bonding frame 7 and the cap 8. As described above, this embodiment has an effect in that, with the contact area between the support 8a and the base 14 (being) made constant, not only stable manufacturing becomes possible, but also the manufacturing yield improves without the shielding of electric field being damaged by the static charge during the anodic bonding.

The specific embodiments according to the present invention have been explained as described above; however, the present invention is not limited to those, but various modifications can be conceived. For example, although the material for the shielding film 9 is aluminum in the above embodiments, as long as the material is conductive that can be at least extendedly transformed, it is included in the scope of the present invention. Moreover, in the above embodiments, the movable electrode 6 and the shielding film 9 are lead to the exterior of the cap 8 by the wiring 10b and the wiring 10d, respectively, so as to be electrically connected to the external output electrodes 11b and 11d, respectively, and then the external output electrodes 11b and 11d are short-circuited by the wiring 10e; however, even if the electrodes are short-circuited with each other by a wiring inside the cap 8, this structure is included in the scope of the present invention. Furthermore, if the external output electrodes 11b and 11d electrically connected to the movable electrode 6 and the shielding film 9, respectively, are arranged so as to be able to connect each other outside the cap 8, because it is easy to process both external output electrodes to be short-circuited only when the anodic bonding is performed, this structure is also included in the scope of the present invention.

What is claimed is:

1. An electrostatic-capacitance-type acceleration sensor comprising:
    a substrate including an acceleration detector having a movable part for detecting an acceleration;
    a bonding frame fixed on the substrate so as to surround the acceleration detector;
    a cap provided on the substrate, a face of the cap opposed to the substrate being constituted by a peripheral region affixed to the bonding frame, and in addition to the peripheral region, a central region; and
    a conductive shielding film formed at least on an entire surface of the central region of the cap, the shielding film electrically connected to the movable part, wherein
    a void is formed between the bonding frame, the cap, and the conductive shielding film such that a part of the bonding frame forms a first wall of the void, a part of the cap forms a second wall of the void, and a part of the conductive shielding film forms a third wall of the void, the cap and the bonding frame being joined at mutually extending portions between the void and exterior sides of the cap and the bonding frame.

2. An electrostatic-capacitance-type acceleration sensor as recited in claim 1, wherein the shielding film is formed extending onto a surface of the peripheral region.

3. An electrostatic-capacitance-type acceleration sensor as recited in claim 2, wherein the shielding film includes a first portion having a first thickness, and a second portion having a larger thickness than the first thickness and provided on the central region.

4. An electrostatic-capacitance-type acceleration sensor as recited in claim 2, wherein a recess for accepting the shielding film is formed either in the bonding frame or in the cap.

5. An electrostatic-capacitance-type acceleration sensor as recited in claim 2, the cap having a support protruding from the central region, wherein the shielding film and the movable part are electrically connected together through the shielding film being formed on a surface of the support.

6. An electrostatic-capacitance-type acceleration sensor comprising:
    a substrate including an acceleration detector having a movable part for detecting acceleration;
    a bonding frame fixed on the substrate so as to surround the acceleration detector;
    a cap provided on the substrate, and composed of a peripheral region, whose face faces the substrate, fixed to the bonding frame and a central region other than the peripheral region;
    a conductive shielding film formed at least on an entire surface of the central region of the cap, wherein a void is formed between the bonding frame, the cap, and the conductive shielding film such that a part of the bonding frame forms a first wall of the void, a part of the cap forms a second wall of the void, and a part of the conductive shielding film forms a third wall of the void, the cap and the bonding frame being joined at mutually extending portions between the void and exterior sides of the cap and the bonding frame;
a first external electrode connected to the movable part; and
a second external electrode connected to the shielding film, wherein
the first external electrode and the second external electrode are arranged to be electrically connectable to each other.

7. The electrostatic-capacitance-type acceleration sensor as recited in claim 1, wherein the void has a depth equal to or smaller than a thickness of the conductive shielding film.

8. The electrostatic-capacitance-type acceleration sensor as recited in claim 1, wherein the void is formed entirely along the bonding frame.

* * * * *